United States Patent [19]

Kogan et al.

[11] Patent Number: 5,051,630
[45] Date of Patent: Sep. 24, 1991

[54] ACCURATE DELAY GENERATOR HAVING A COMPENSATION FEATURE FOR POWER SUPPLY VOLTAGE AND SEMICONDUCTOR PROCESS VARIATIONS

[75] Inventors: Grigory Kogan, Portland; David J. McKinney, Beaverton, both of Oreg.

[73] Assignee: Tektronix, Inc., Beaverton, Oreg.

[21] Appl. No.: 491,790

[22] Filed: Mar. 12, 1990

[51] Int. Cl.$^5$ .................. H03K 5/159; H03K 19/094; H03K 3/01

[52] U.S. Cl. .................................... 307/603; 307/605; 307/595; 307/597; 307/451; 328/55; 328/66

[58] Field of Search ............... 307/605, 603, 451, 585, 307/445, 268, 602, 595, 597; 328/55, 66

[56] References Cited

U.S. PATENT DOCUMENTS

| | | | |
|---|---|---|---|
| 4,016,434 | 4/1977 | DeFilippi | 307/297 |
| 4,433,252 | 2/1984 | Lewis | 307/269 |
| 4,473,762 | 9/1984 | Iwahashi et al. | 307/594 |
| 4,571,503 | 2/1986 | Tobita | 307/269 |
| 4,645,998 | 2/1987 | Shinohara | 323/313 |
| 4,694,199 | 9/1987 | Goetz | 307/297 |
| 4,716,307 | 12/1987 | Aoyama | 307/297 |
| 4,806,804 | 2/1989 | O'Leary | 307/605 |
| 4,931,668 | 6/1990 | Kikuda et al. | 307/268 |

OTHER PUBLICATIONS

Muller et al., "Device Electronics for Integrated Circuits", pp. 346–349 and 364–367.

Primary Examiner—Stanley D. Miller
Assistant Examiner—Trong Phan
Attorney, Agent, or Firm—Peter J. Meza; Francis I. Gray

[57] ABSTRACT

An accurate delay generator circuit for delaying the rising and falling edge of an input signal includes: a current switch having an input for receiving the input signal, first and second current inputs, and a current output; a p-channel transistor coupled to the first current input of the current switch; a first threshold voltage generator coupled to the gate of the p-channel transistor for generating a voltage equal to twice a p-channel threshold voltage with respect to VDD; an n-channel transistor coupled to the second current input of the current switch; a second threshold voltage generator coupled to the gate of the n-channel transistor for generating a voltage equal to twice an n-channel thresold voltage with respect to ground; a capacitor coupled to the output of the current switch; and an output inverter stage coupled to the output of the current switch for providing the delayed input signal. The threshold voltage generators provide constant voltages that are independent of VDD and ground from the gate to source of the p-channel and n-channel transistors respectively. The constant gate to source voltages produce relatively constant charge and discharge currents to the capacitor that in turn produce a relatively constant delay for both the rising and falling edge of the input signal. In addition, the configuration of the present invention compensates for errors in the value of the delay produced by variations in semiconductor processing parameters.

41 Claims, 6 Drawing Sheets

ACCURATE DELAY GENERATOR HAVING A COMPENSATION FEATURE FOR POWER SUPPLY VOLTAGE AND SEMICONDUCTOR PROCESS VARIATIONS

BACKGROUND OF THE INVENTION

This invention relates to semiconductor integrated delay circuits and more particularly to a semiconductor integrated delay circuit wherein the effect of semiconductor process variations and power supply voltage variations on the value of the delay are minimized.

Generally, prior art integrated delay circuits fabricated with a complimentary metal oxide semiconductor ("CMOS") process include a series of simple inverter circuits wherein the value of the delay is determined by the gate delay through one inverter and the number of inverters in the series. Such a prior art delay circuit is shown in FIG. 1. Each inverter includes a p-channel transistor and an n-channel transistor. The gates of the transistors are coupled together to form the input of the inverter and the drains of the transistors are coupled together to form the output of the inverter. The source of the p-channel transistor is connected to a source of supply voltage, designated VDD. The value of VDD is typically +5 volts for powering a CMOS circuit. The input of the first inverter in the series receives the input signal designated VIN and the output of the last inverter of the series produces the delayed output signal designated VOUT. The input signal VIN, which is a pulse or square wave, and the delayed output signal VOUT are shown in FIG. 2, where $T_R$ is the value of the rising edge delay and $T_F$ is the value of the falling edge delay.

The problem with the delay circuit of FIG. 1 is that the processing variations of the semiconductor process, which in turn affect transistor parameters, combined with the variations in the supply voltage, which varies between 4.5 volts and 5.5 volts, produces a range of delays wherein the worst case longest delay may be up to 2.5 times the worst case shortest delay. What is desired is a semiconductor integrated delay circuit wherein these effects may be minimized in order to produce a more accurate delay value.

SUMMARY OF THE INVENTION

Therefore, according to the present invention, an accurate delay generator circuit for delaying the rising and falling edge of an input signal includes: a current switch having an input for receiving the input signal, first and second current inputs, and a current output; a p-channel transistor, the drain of the p-channel transistor being connected to the first current input of the current switch; a first threshold voltage generator coupled to the gate of the p-channel transistor for generating a voltage equal to twice a p-channel threshold voltage with respect to VDD; an n-channel transistor, the drain of the n-channel transistor being connected to the second current input of the current switch; a second threshold voltage generator connected to the gate of the n-channel transistor for generating a voltage equal to twice an n-channel threshold voltage with respect to ground; a capacitor connected to the output of the current switch; and an output inverter stage connected to the output of the current switch for providing the delayed input signal.

The threshold voltage generators provide a constant voltage that is substantially independent of VDD from the gate to the source of the transistors. The constant gate to source voltage produces relatively constant charge and discharge currents to the capacitor that in turn produces a relatively constant delay for both the rising and falling edge of the input signal. In addition, the configuration of the present invention compensates for errors in the value of the delay produced by variations in semiconductor processing parameters. The foregoing summary of the invention will become more readily apparent from the following detailed description that proceeds with reference to the drawings.

DESCRIPTION OF THE PREFERRED EMBODIMENT

Figure 3:
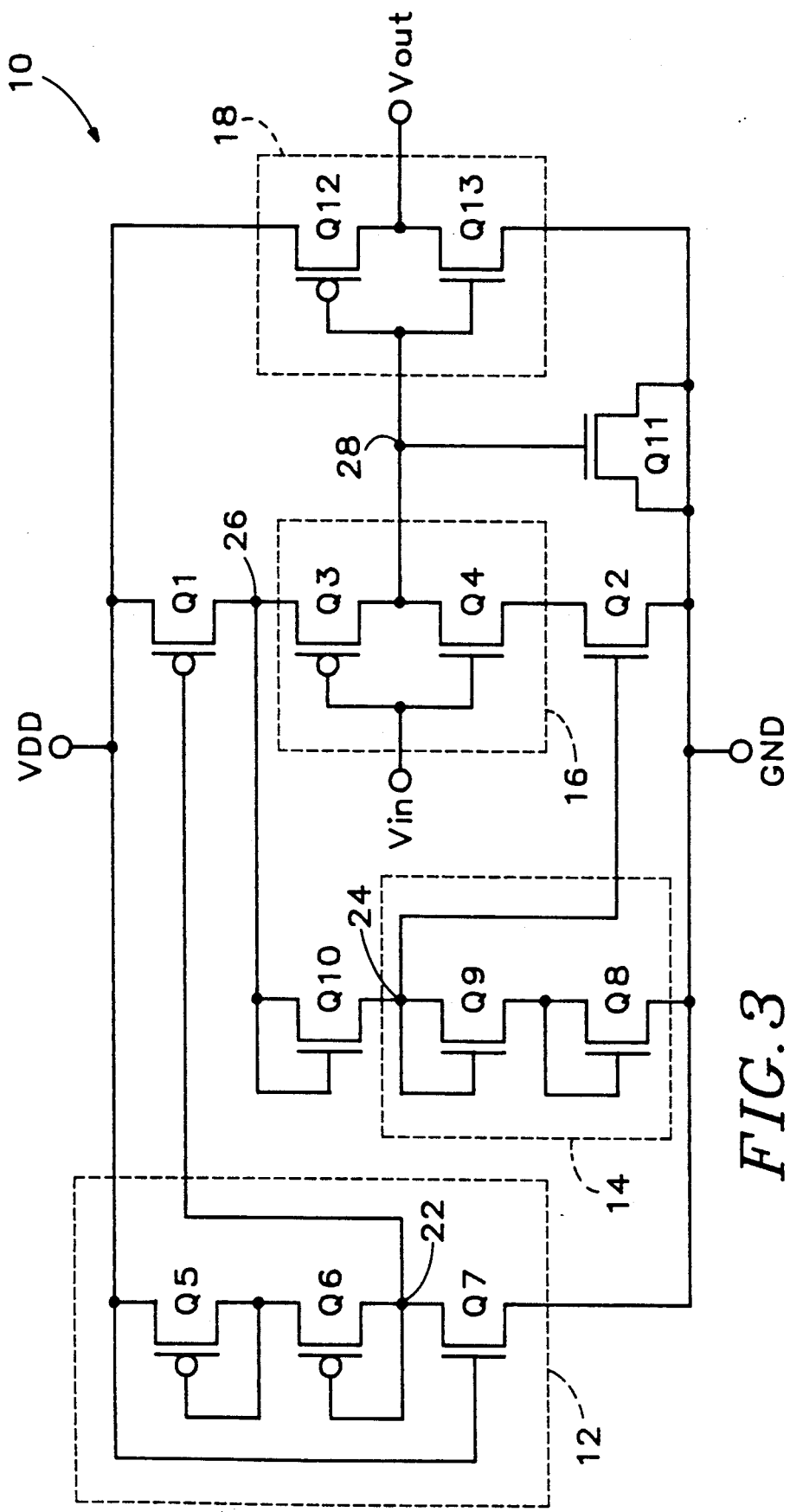
FIG. 3 is a schematic diagram of a first embodiment of the present invention for delaying the rising edge and falling edge of an input signal according to the present invention.

An accurate delay generator 10 for delaying the rising and falling edge of an input signal according to the present invention is shown in FIG. 3. A current switch 16 has an input for receiving the input signal, VIN, first and second current inputs, and a current output. A p-channel transistor Q1 has a source connected to the supply voltage, VDD, and a drain connected to the first current input of current switch 16. A first threshold voltage generator 12 is connected to the gate of transistor Q1 for generating a voltage at node 22 that is equal to twice the value of a p-channel threshold voltage, designated Vpt, with respect to the supply voltage, VDD. An n-channel transistor Q2 has a source connected to ground, designated GND, and a drain connected to the second current input of current switch 16. A second threshold voltage generator 14 is connected to the gate of transistor Q2 for generating a voltage at node 24 that is equal to twice the value of an n-channel threshold voltage, designated Vnt, with respect to ground. An n-channel transistor Q11 serves as a capacitor for storing charge received at node 28 that is the current output of current switch 16. An output inverter stage 18 has an input coupled to the current output of current switch 16 at node 28 and an output for providing a delayed input signal designated VOUT.

The current switch 16 includes a p-channel transistor Q3 and an n-channel transistor Q4, the gates of transistors Q3 and Q4 are connected together to receive the input signal, VIN, and the drains of transistors Q3 and Q4 are connected together to provide a current output at node 28. The source of transistor Q3 serves as the first current input to current switch 16 and is coupled to the drain of transistor Q1 at node 26. The source of transistor Q4 serves as the second current input to current switch 16 and is coupled to the drain of transistor Q2.

The first threshold generator 12 includes two p-channel transistors Q5 and Q6 and an n-channel transistor Q7. The source of transistor Q5 is connected to VDD and the gate and drain of transistor Q5 are connected together and to the source of transistor Q6. The gate and drain of transistor Q6 are connected together and to the drain of transistor Q7 to produce a voltage equal to VDD $-2$ Vpt at node 22, where Vpt is equal to the p-channel threshold voltage. The gate of transistor Q7 is connected to VDD and the source of transistor Q7 is connected to ground. The second threshold generator 14 includes two n-channel transistors Q8 and Q9. The source of transistor Q8 is connected to ground and the gate and drain of transistor Q8 are connected together and to the source of transistor Q9. The gate and drain of transistor Q9 are connected together and to the drain of transistor Q1 through n-channel transistor Q10 to produce a voltage equal to 2 Vnt$-$GND at node 24, where Vnt is equal to the n-channel threshold voltage. The source of transistor Q10 is connected to the gate and drain of transistor Q9 at node 24 and the gate and drain of transistor Q10 are connected together and to the drain of transistor Q1 at node 26 to provide a voltage equal to 3 Vnt$-$GND.

A capacitor for storing charge provided by the current output of current switch 16 is connected at node 28. The capacitor is created by connecting the gate of transistor Q11 to node 28 and the drain and source of transistor Q11 to ground. The gate of transistor Q11 forms one plate of the capacitor, the body of transistor Q11 forms the other plate of the capacitor and an oxide layer forms the dielectric layer between the two plates. The value of the capacitance of transistor Q11 is determined by the size of the transistor and semiconductor process parameters such as doping densities and the thickness of the dielectric oxide layer.

An output inverter stage 18 is an inverter that includes a p-channel transistor Q12 and an n-channel transistor Q13. The inverter has an input, an output, and first and second power terminals. The input of the inverter in the output inverter stage is connected to node 28 and the first power terminal is connected to VDD. The second power terminal of the inverter is connected to ground, and the output of the inverter in the output inverter stage 18 provides the output signal VOUT.

The first threshold voltage generator 12 and second threshold voltage generator 14 provide stable voltages across the gate and source of transistors Q1 and Q2, respectively. The voltage at node 22 is VDD$-2$ Vpt because transistor Q7 is on and is much smaller than transistors Q5 and Q6. Since the voltage at node 22, which is the gate of transistor Q1, is equal to VDD$-2$ Vpt and the voltage at the source of transistor Q1 is equal to VDD, the voltage from the source to the gate of transistor Q1 is equal to 2 Vpt and, to a first order approximation, is not a function of VDD. Thus the current produced at the drain of transistor Q1, to a first order approximation, is also not a function of VDD. The voltage at node 24 is 2 Vnt because transistor Q1 is on and is much smaller than transistors Q8 and Q9. Similarly, since the voltage at node 24, which is the gate of transistor Q2, is equal to 2 Vnt$-$GND and the voltage at the source of transistor Q2 is equal to ground, or zero volts, the voltage from the gate to the source of transistor Q2 is stable and equal to 2 Vnt. Thus the current produced at the drain of transistor Q2 is also stable. The currents produced at the drains of transistors Q1 and Q2 are charge and discharge paths that are used to selectively charge and discharge the capacitor Q11. Thus the voltage at node 28 is a ramp voltage. The value of the rising or falling edge delay is determined by the amount of time needed for the ramp to cross the CMOS switching threshold voltage.

The charge or discharge mode of the accurate delay generator 10 is determined by the polarity of the input signal, VIN. If VIN is a rising edge, transistor Q3 begins to turn off and transistor Q4 begins to turn on, thus allowing the current at the drain of transistor Q2 to discharge capacitor Q11. Oppositely, if VIN is a falling edge, transistor Q4 begins to turn off and transistor Q3 begins to turn on, thus allowing the current at the drain of transistor Q1 to charge capacitor Q11. The size of transistors Q1 and Q2 are chosen to be significantly smaller than the size of transistors Q3 and Q4 in order that the charge and discharge rate is determined only by transistors Q1 and Q2. In other words, the series resistance of transistors Q3 and Q4 is made small to not affect the stable charge and discharge currents provided by the drains of transistors Q1 and Q2. The precharge level on capacitor Q11 is not affected by VDD variations because the source of transistor Q3 is connected to node 26, which has a stable voltage level of 3 Vnt. Since the precharge level and the charge and discharge currents are stable with respect to variations in VDD, the charge and discharge rates of capacitor Q11 are also stable.

The input to the inverter in the output inverter stage 18 is connected to node 28, which has a maximum voltage of 3 Vnt. Since this voltage is substantially stable with respect to VDD, the transitions from logic high to logic low, and vice versa, are also stable with respect to VDD. However, the voltage at node 28 swings only between ground and 3 Vnt. The output inverter stage 18 is needed to level shift the voltage at node 28 to proper CMOS logic levels of VDD and ground. The output inverter stage 18 is also needed to place the delayed output voltage, VOUT, in phase with the input signal, VIN. Note that the input signal VIN is inverted once by the current switch 16.

Therefore it has been shown that an accurate delay generator provides a delayed output signal that is in phase with the input signal, wherein the value of the rising edge delay, $T_R$, and the value of the falling edge delay, $T_F$, are substantially independent of fluctuations of the supply voltage, VDD. The rising edge delay, $T_R$, is set by the size of transistor Q2 and the size of capacitor Q11, and the falling edge delay, $T_F$, is set by the size of transistor Q1 and the size of capacitor Q11.

The accurate delay generator 10 also produces an accurate delay with respect to semiconductor process variations. Threshold voltage is a complex function of process parameters. However, it may be observed that as threshold voltages increase, the delay through a transistor or inverter stage correspondingly increases. Thus, in a "slow" semiconductor process having high threshold voltages, the delay produced by delay generator 10 would increase. This increase in delay is compensated by the higher voltages of VDD$-2$ Vpt and 2 Vnt at nodes 22 and 24, respectively. The increased voltage drives the gate to source voltage higher on transistors Q1 and Q2, producing higher charge and discharge currents that ultimately lead to a compensating decreased delay. Similarly, underetching of the polysilicon used to form the gates of the transistors using a CMOS semiconductor process increases threshold voltage. If the polysilicon gates are underetched, the capacitance of transistor Q11 is increased and the delay is correspondingly increased. The increase in delay is compensated by the same increase in voltage at nodes 22 and 24 that produces higher charge and discharge currents that ultimately lead to the compensating decreased delay.

Figure 1:
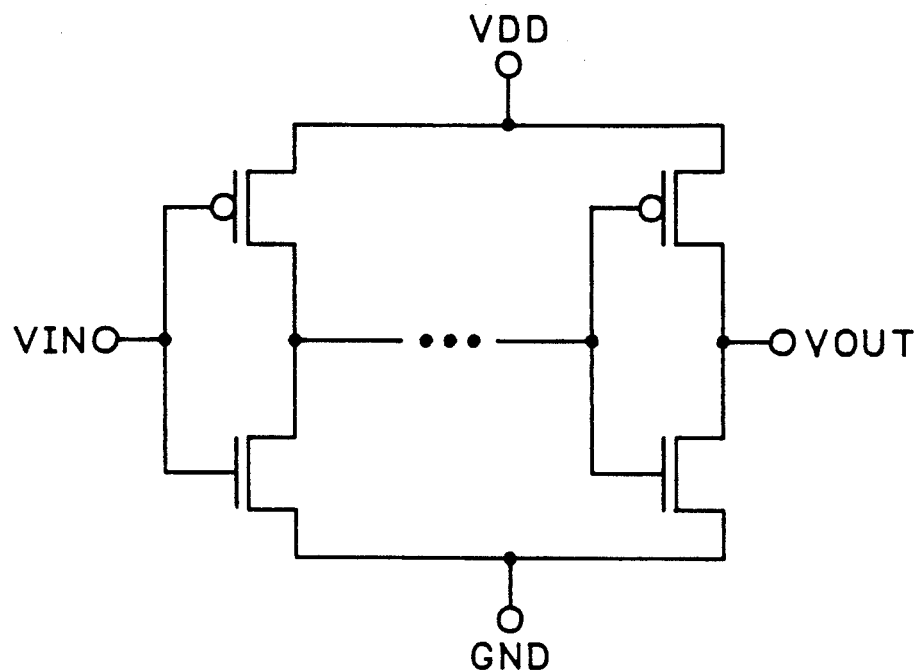
FIG. 1 is a schematic diagram of a prior art delay generator circuit.
Figure 2:
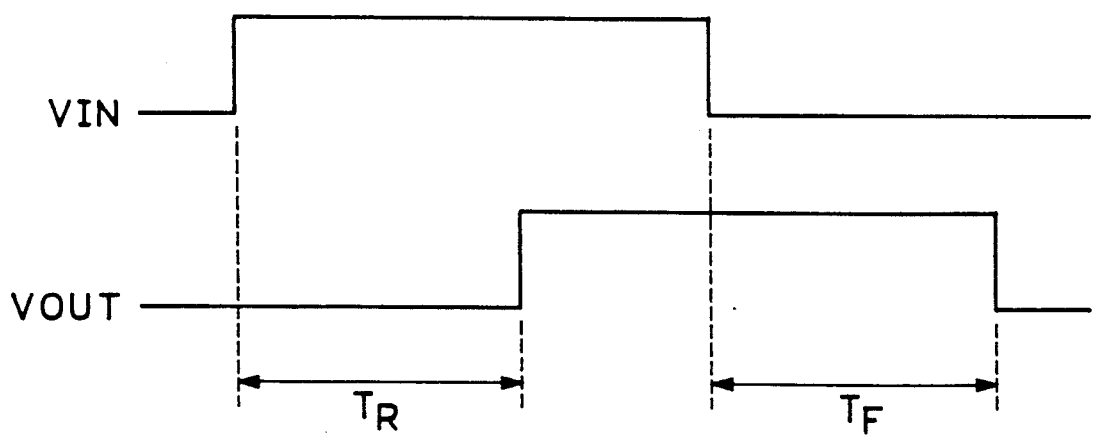
FIG. 2 is a plot of voltage versus time for a typical input signal and the corresponding delayed output signal showing the rising edge and falling edge delay time.

Therefore it has been shown that an accurate delay generator provides a delayed output signal that is not a function of process parameters. The compensating effects of accurate delay generator 10 provide for a delay that varies approximately 20% with variations in VDD and semiconductor processing parameters, instead of the 250% variation in delay provided by the prior art delay circuit shown in FIG. 1.

Figure 4:
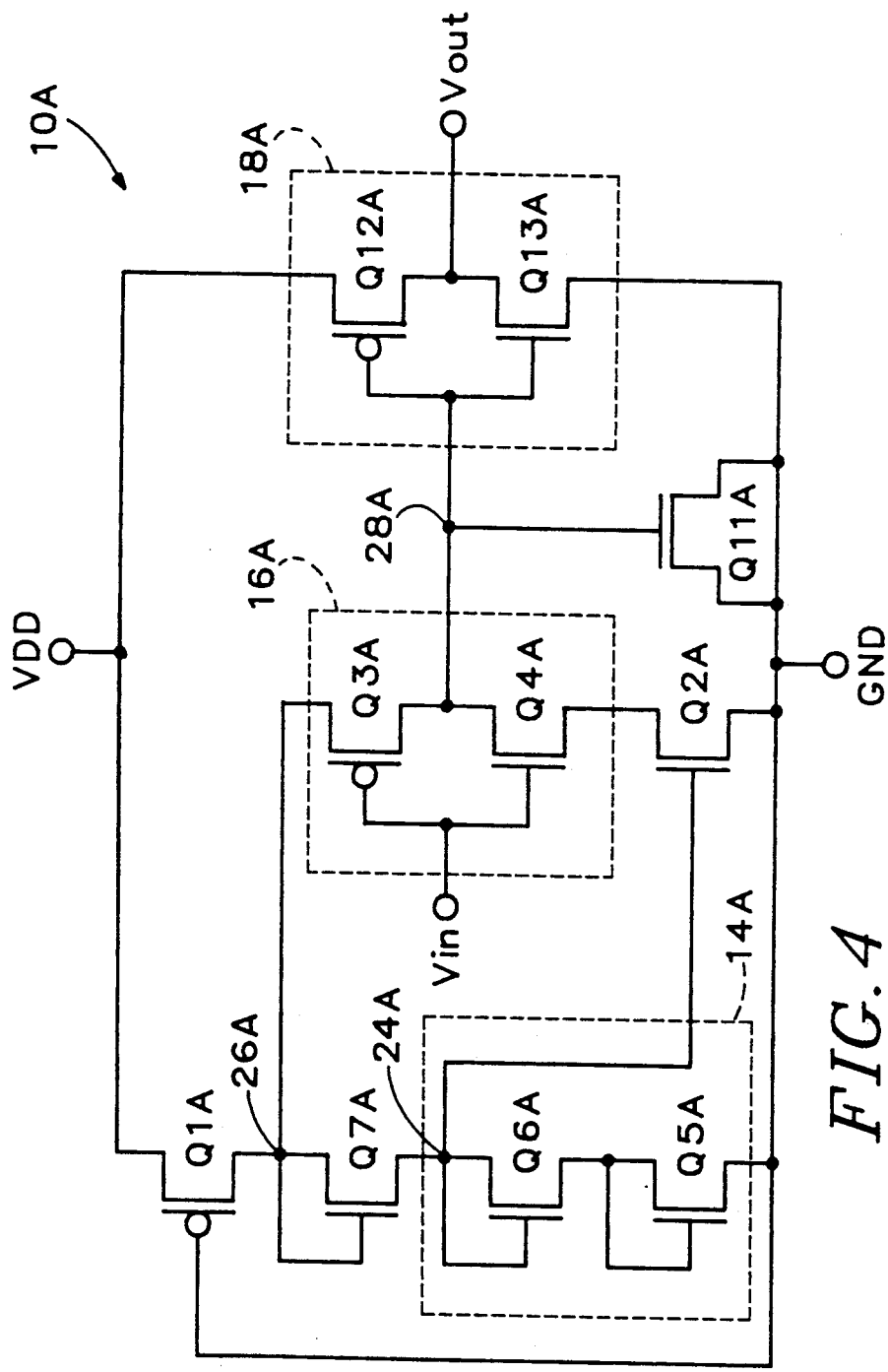
FIG. 4 is a schematic diagram of a second embodiment of the present invention for accurately delaying the rising edge of the input signal.

An alternative embodiment 10A of the accurate delay generator of the present invention for accurately delaying only the rising edge of an input signal is shown in FIG. 4. As in the previous embodiment 10, accurate delay generator 10A includes a current switch 16A, a p-channel transistor Q1A, an n-channel transistor Q2A, a capacitor Q11A, and an output inverter stage 18A. Note that the transistors and node designations for accurate delay generator 10A are the same as for the accurate delay generator 10 of FIG. 3 for the above mentioned circuit elements, with only the suffix "A" being added, except for the redesignation of transistors Q5A, Q6A, and Q7A. Therefore the description of these circuit elements and the analysis of their operation proceeds as above. However, the accurate delay generator 10A differs from the accurate delay generator 10 in that only a single threshold generator 14A is used. Threshold generator 14A provides a voltage equal to 2 Vnt at node 24A and a voltage equal to 3 Vnt at node 26A. These voltages are stable because the size of transistor Q1A is made small with respect to the size of transistors Q5A, Q6A, and Q7A.

On a rising edge of the input signal, transistor Q3A turns off and transistor Q4A turns on to discharge capacitor Q11A through transistor Q2A. The rate of this discharge current is stable with respect to variations in VDD, the analysis proceeding as above. However, on a falling edge of the input signal, transistors Q4A turns off and transistor Q3A turns on to charge capacitor Q11A through transistor Q1A. Although this charge path provides an increasing ramp voltage, the rate of the voltage increase is not as well controlled as the discharge path. This is because the gate of transistor Q1A is connected to ground and not to a stable voltage. An accurate delay is produced on the rising edge only in accurate delay generator 10A, but three less transistors are required.

Figure 5:
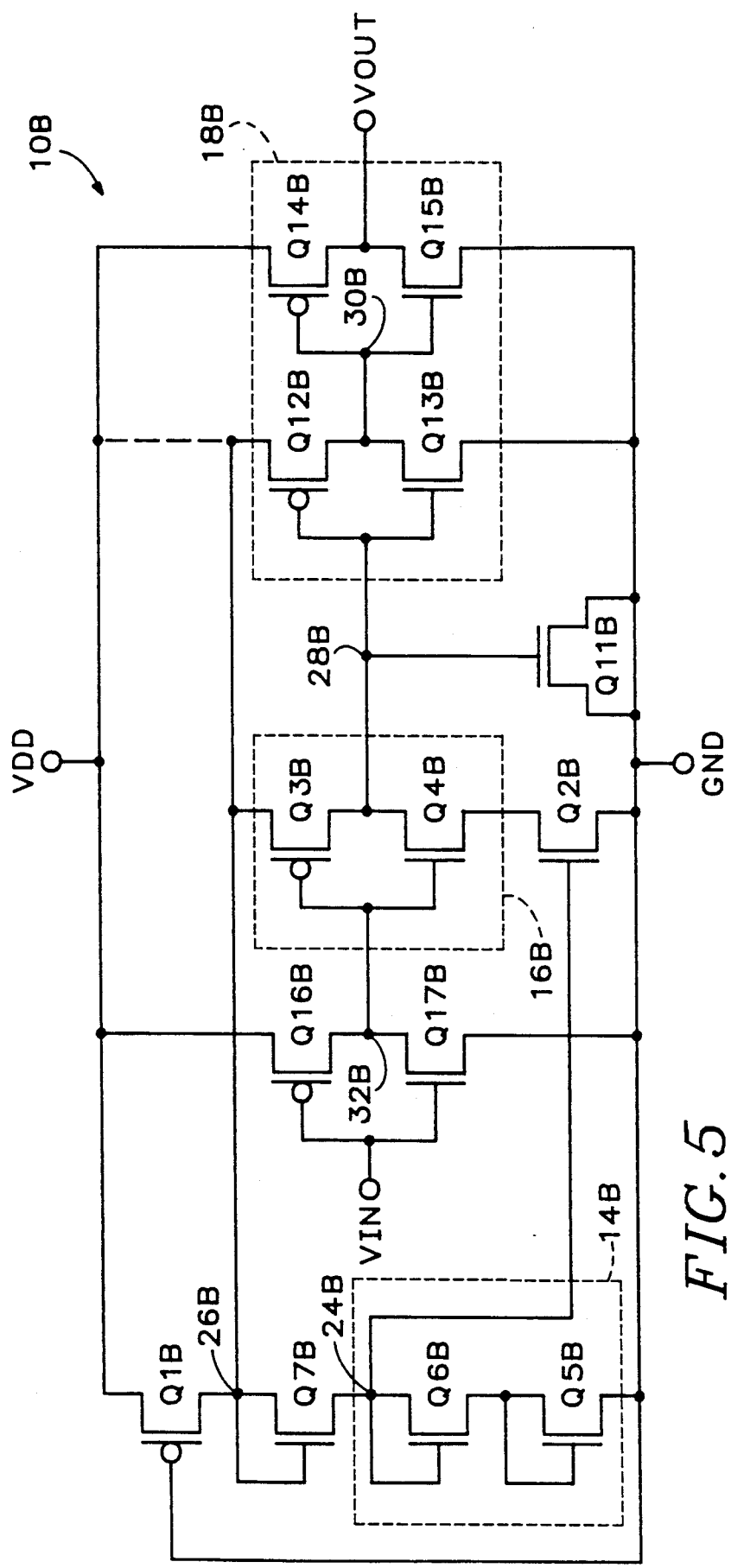
FIG. 5 is a schematic diagram of a third embodiment of the present invention for accurately delaying the falling edge of the input signal.

A second alternative embodiment 10B of the accurate delay generator of the present invention for accurately delaying only the falling edge of an input signal is shown in FIG. 5. As in the previous embodiment 10A, accurate delay generator 10B includes a current switch 16B, a p-channel transistor Q1B, an n-channel transistor Q2B, a capacitor Q11B, and a threshold voltage generator 14B. Note that the transistors and node designations for accurate delay generator 10B are generally the same as for the accurate delay generator 10A of FIG. 4 for the above mentioned circuit elements, with only the suffix "B" being added. Therefore the description of these circuit elements and the analysis of their operation proceeds as above. However, the accurate delay generator 10B differs from the accurate delay generator 10A in that an additional inverter including transistors Q14B and Q15B has been added to the output inverter stage. Note that the addition of another inverter enables the first power terminal of the first inverter (the source of transistor Q12B) to be connected to either VDD or the first current input of the current switch 16B (the source of transistor Q3B). The latter connection provides a slight performance enhancement in that the logic switching threshold voltage of the first inverter is not, to a first order approximation, a function of VDD. In addition, an input inverter stage including transistors Q16B and Q17B is included that reverses the polarity of the signal applied to the current switch 16B.

On a falling edge of the input signal, transistor Q16B turns on and transistor Q17B turns off, transistor Q3B turns off and transistor Q4A turns on to discharge capacitor Q11B through transistor Q2B. As in the previous embodiment of FIG. 4, the rate of this discharge current is stable with respect to variations in VDD. However, on a rising edge of the input signal, transistor Q17B turns on and transistor Q16B turns off, transistor Q4B turns off and transistor Q3B turns on to charge capacitor Q11B through transistor Q1B. Although this charge path provides an increasing ramp voltage, the rate of the voltage increase is not as well controlled as the discharge path. This is because the gate of transistor Q1B is connected to ground and not to a stable voltage. An accurate delay is produced on the falling edge only in accurate delay generator 10B.

Figure 6:
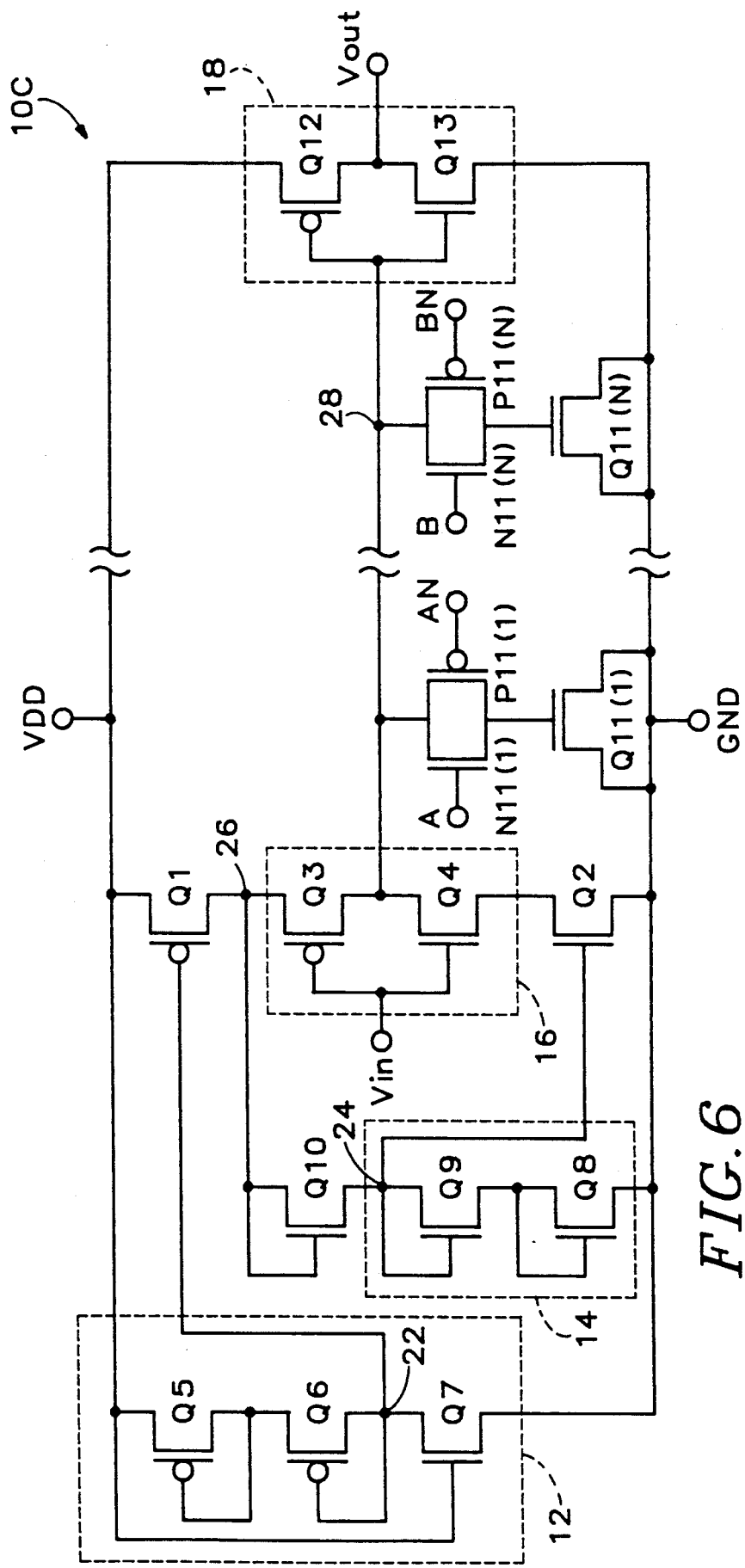
FIG. 6 is a schematic diagram of the first embodiment of the present invention including an adjustable rising and falling edge delay feature.

Another embodiment of an accurate delay generator including an adjustable rising and falling edge delay feature is shown in FIG. 6. The capacitor Q11 in accurate delay generator 10 has been replaced by a plurality of n-channel transistors Q11(1) through Q11(N) to provide the accurate delay generator 10C shown in FIG. 6. The source and drain of each transistor Q11(1) through Q11(N) is coupled together and to GND. The drain of each of the transistors is coupled to a plurality of switches each including an n-channel transistor N11(1) through N11(N) and a p-channel transistor P11(1) through P11(N). Each switch is used to selectively energize the gate of each of the capacitors, transistors Q11(1) through Q11(N). Logic signals A and AN are complementary logic signals that selectively open or close the first switch to add the capacitance provided by capacitor Q11(1). Similarly, logic signals B and BN are complementary logic signals that selectively open or close the Nth switch to add the capacitance provided by capacitor Q11(N). Only two capacitors are shown in FIG. 6, but any number may be used.

Figure 7:
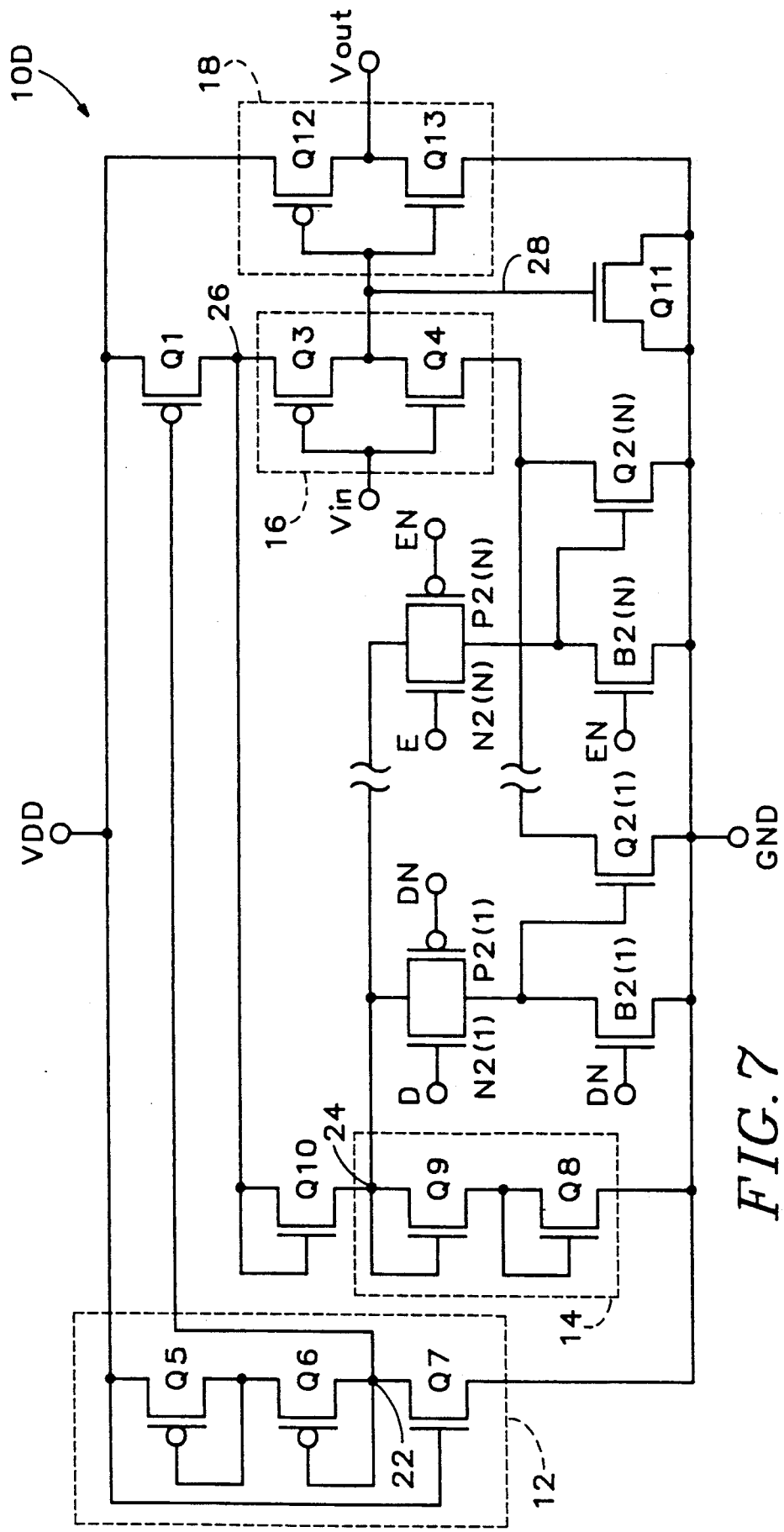
FIG. 7 is a schematic diagram of the first embodiment of the present invention including an adjustable rising edge delay feature.

Another embodiment of the accurate delay generator 10 of FIG. 3 including an adjustable rising edge delay feature is shown in FIG. 7. Transistor Q2 in accurate delay generator 1o of FIG. 3 has been replaced by a plurality of n-channel transistors Q2(1) through Q2(N). The drain of each transistor is coupled together and to the second current input of current switch 16. The source of each transistor is coupled to GND. The gate of each of the transistors is coupled to a plurality of switches each including an n-channel transistor N2(1) through N2(N) and a p-channel transistor P2(1) through P2(N). Each switch is used to selectively energize the gate of each of the transistors Q2(1) through Q2(N). Logic signals D and DN are complementary logic signals that selectively open or close the first switch to add the extra discharge path provided by transistor Q2(1). Similarly, logic signals E and EN are complementary logic signals that selectively open or close the Nth discharge switch to add the extra discharge path provided by transistor Q2(N). Bias transistors B2(1) through B2(N) are provided so that the gate to transistors Q2(1) through Q2(N) do not float when the corresponding switch is closed. Only two discharge stages are shown in FIG. 7, but any number may be used.

Although this invention has been disclosed and illustrated with reference to circuit diagrams of three embodiments, the exact circuit configuration may be changed without departing from the true scope of the invention. For example, the number of transistors used to create the stable threshold voltages may be changed to any multiple suitable for the requirements of the semiconductor process used. As another example, an integrated capacitor other than an n-channel transistor may be used for the capacitor. In addition, the polarity of the devices may be reversed if the circuit is then correctly biased. As yet another example, the adjustable capacitance and discharge features of FIGS. 6 and 7 may be used with the alternative embodiments of the present invention shown in FIGS. 4 and 5. The invention is, therefore, to be limited only as indicated by the scope of the following claims.

We claim:

1. An accurate delay generator for delaying the rising and falling edge of an input signal comprising:
   (a) a current switch having an input for receiving the input signal, first and second current inputs, and a current output;
   (b) means for charging having a control terminal, a first controlled terminal coupled to a first source of supply voltage, and a second controlled terminal coupled to the first current input of the current switch;
   (c) means coupled to the control terminal of the charging means for generating a first multiple threshold voltage with respect to the first source of voltage, wherein the value of the first multiple threshold voltage is equal to N times a first threshold voltage of the first multiple threshold voltage generating means, where N is an integer greater than one;
   (d) means for discharging having a control terminal, a first controlled terminal coupled to a second source of supply voltage, and a second controlled terminal coupled to the second current input of the current switch;
   (e) means coupled to the control terminal of the discharging means for generating a second multiple threshold voltage with respect to the second source of voltage, wherein the value of the second multiple threshold voltage is equal to N times a second threshold voltage of the second multiple threshold voltage generating means, where N is an integer greater than one;
   (f) means for storing charge coupled to the current output of the current switch; and
   (g) an output inverter stage having an input coupled to the current output of the current switch and an output for providing a delayed version of the input signal.

2. An accurate delay generator as in claim 1 wherein the charging means comprises a first multiple threshold voltage transistor of a first polarity type having a control terminal coupled to the control terminal of the charging means, a first controlled terminal coupled to the first controlled terminal of the charging means, and a second controlled terminal coupled to the second controlled terminal of the charging means.

3. An accurate delay generator as in claim 1 wherein the discharging means comprises a second transistor of a second polarity type having a control terminal coupled to the control terminal of the discharging means, a first controlled terminal coupled to the first controlled terminal of the discharging means, and a second controlled terminal coupled to the second controlled terminal of the discharging means.

4. An accurate delay generator as in claim 1 wherein the discharging means comprises:
   (a) a plurality of transistors of a second polarity type each having a control terminal, a first controlled terminal, and a second controlled terminal, the first controlled terminals being coupled together and to the second source of supply voltage and the second controlled terminals being coupled together and to the second current input of the current switch; and
   (b) a plurality of switches for selectively energizing the control terminal of each of the transistors.

5. An accurate delay generator as in claim 1 wherein the current switch comprises:
   (a) a third transistor of a first polarity type; and
   (b) a fourth transistor of a second polarity type, the third transistor having a control terminal coupled to the input, a first controlled terminal coupled to the first current input, and a second controlled terminal coupled to the current output, the fourth transistor having a control terminal coupled to the input, a first controlled terminal coupled to the second current input, and a second controlled terminal coupled to the current output.

6. An accurate delay generator as in claim 1 wherein the first multiple threshold voltage generating means comprises:
   (a) fifth and sixth transistors of a first polarity type each having a control terminal and first and second controlled terminals; and
   (b) a seventh transistor of a second polarity type having a control terminal and first and second controlled terminals, the first controlled terminal of the fifth transistor being coupled to the first source of supply voltage, the control terminal and the second controlled terminal of the fifth transistor being coupled together and to the first controlled terminal of the sixth transistor, the control terminal and the second controlled terminal of the sixth transistor being coupled together and to the second controlled terminal of the seventh transistor to produce the first multiple threshold voltage, the control terminal of the seventh transistor being coupled to the first source of supply voltage, and the first controlled terminal of the seventh transistor being coupled to the second source of supply voltage.

7. An accurate delay generator as in claim 1 wherein the second multiple threshold voltage generating means comprises eighth and ninth transistors of a second polarity type each having a control terminal and first and second controlled terminals, the first controlled terminal of the eighth transistor being coupled to the second source of supply voltage, the control terminal and the second controlled terminal of the eighth transistor being coupled together and to the first controlled terminal of the ninth transistor, the control terminal and the second controlled terminal of the ninth transistor being coupled together and to the control terminal of the discharging means to produce the second multiple threshold voltage.

8. An accurate delay generator as in claim 1 wherein the charge storing means comprises a transistor of a second polarity type having a control terminal coupled to the current output of the current switch and first and second controlled terminals coupled to the second source of supply voltage.

9. An accurate delay generator as in claim 1 wherein the charge storing means comprises:
   (a) a plurality of transistors of a second polarity type each having a control terminal and first and second controlled terminals, the first and second controlled terminals being coupled together and to the second source of supply voltage; and
   (b) a plurality of switches for selectively coupling the control terminal of each of the transistors to the current output of the current switch.

10. An accurate delay generator as in claim 1 further comprising means coupled to the second controlled terminal of the charging means for generating a third multiple threshold voltage with respect to the second source of supply voltage, wherein the value of the third multiple threshold voltage is equal to M times the second threshold voltage where M is an integer greater than two.

11. An accurate delay generator as in claim 10 wherein the third multiple threshold voltage generating means comprises a tenth transistor of a second polarity type interposed between the charging means and the second multiple threshold voltage generating means, the tenth transistor having a first controlled terminal coupled to the second multiple threshold voltage generating means, and a control terminal and a second controlled terminal coupled together and to the second controlled terminal of the charging means to produce the third multiple threshold voltage.

12. An accurate delay generator as in claim 1 wherein the output inverter stage comprises:
   an inverter having an input coupled to the input of the output inverter stage, a first power terminal coupled to the first source of supply voltage, a second power terminal coupled to the second source of supply voltage, and an output coupled to the output of the output inverter stage.

13. An accurate delay generator as in claim 12 wherein the inverter comprises:
   (a) a transistor of a first polarity type having a control terminal coupled to the input, a first controlled terminal coupled to the first power terminal, and a second controlled terminal coupled to the output; and
   (b) a transistor of a second polarity type having a control terminal coupled to the input, a first controlled terminal coupled to the second power terminal, and a second controlled terminal coupled to the output.

14. An accurate delay generator for delaying the rising edge of an input signal comprising:
   (a) a current switch having an input for receiving an input signal, first and second current inputs, and a current output;
   (b) means for charging having a first controlled terminal coupled to a first source of supply voltage, a control terminal coupled to a second source of supply voltage, and a second controlled terminal coupled to the first current input of the current switch;
   (c) means for discharging having a control terminal, a first controlled terminal coupled to a second source of supply voltage, and a second controlled terminal coupled to the second current input of the current switch
   (d) means coupled to the control terminal of the discharging means for generating a first multiple threshold voltage with respect to the second source of voltage, wherein the value of the first multiple threshold voltage is equal to N times a first threshold voltage of the first multiple threshold voltage generating means, where N is an integer greater than one;
   (e) means for storing charge coupled to the current output of the current switch; and
   (f) an output inverter stage having an input coupled to the current output of the current switch and an output for providing a delayed version of the input signal.

15. An accurate delay generator as in claim 14 wherein the charging means comprises a first transistor of a first polarity type having a control terminal coupled to the control terminal of the charging means, a first controlled terminal coupled to the first controlled terminal of the charging means, and a second controlled terminal coupled to the second controlled terminal of the charging means.

16. An accurate delay generator as in claim 14 wherein the discharging means comprises a second transistor of a second polarity type having a control terminal coupled to the control terminal of the discharging means, a first controlled terminal coupled to the first controlled terminal of the discharging means, and a second controlled terminal coupled to the second controlled terminal of the discharging means.

17. An accurate delay generator as in claim 14 wherein the discharging means comprises:
   (a) a plurality of transistors of a second polarity type each having a control terminal, a first controlled terminal, and a second controlled terminal, the first controlled terminals being coupled together and to the second source of supply voltage and the second controlled terminals being coupled together and to the second current input of the current switch; and
   (b) a plurality of switches for selectively energizing the control terminal of each of the transistors.

18. An accurate delay generator as in claim 14 wherein the current switch comprises:
   (a) a third transistor of a first polarity type; and
   (b) a fourth transistor of a second polarity type, the third transistor having a control terminal coupled to the input, a first controlled terminal coupled to the first current input, and a second controlled terminal coupled to the current output, and the fourth transistor having a control terminal coupled to the input, a first controlled terminal coupled to the second current input, and a second controlled terminal coupled to the current output.

19. An accurate delay generator as in claim 14 wherein the first multiple threshold voltage generating means comprises fifth and sixth transistors of a second polarity type each having a control terminal and first and second controlled terminals, the first controlled terminal of the fifth transistor being coupled to the second source of supply voltage, the control terminal and the second controlled terminal of the fifth transistor being coupled together and to the first controlled terminal of the sixth transistor, the control terminal and the second controlled terminal of the sixth transistor being coupled together and to the control terminal of the discharging means to product the first multiple threshold voltage.

20. An accurate delay generator as in claim 14 wherein the charge storing means comprises a transistor of a second polarity type having a control terminal coupled to the current output of the current switch and first and second controlled terminals coupled to the second source of supply voltage.

21. An accurate delay generator as in claim 14 wherein the charge storing means comprises:
(a) a plurality of transistors of a second polarity type each having a control terminal and first and second controlled terminals, the first and second controlled terminals being coupled together and to the second source of supply voltage; and
(b) a plurality of switches for selectively coupling the control terminal of each of the transistors to the current output of the current switch.

22. An accurate delay generator as in claim 14 further comprising means coupled to the second controlled terminal of the charging means for generating a second multiple threshold voltage with respect to the second source of supply voltage, wherein the value of the second multiple threshold voltage is equal to M times the first threshold voltage where M is an integer greater than two.

23. An accurate delay generator as in claim 22 wherein the second multiple threshold voltage generating means comprises a seventh transistor of a second polarity type interposed between the charging means and the first multiple threshold voltage generating means, the seventh transistor having a first controlled terminal coupled to the first multiple threshold voltage generating means, and a control terminal and a second controlled terminal coupled together and to the second controlled terminal of the charging means to produce the second multiple threshold voltage.

24. An accurate delay generator as in claim 14 wherein the output inverter stage comprises
an inverter having an input coupled to the input of the output inverter stage, a first power terminal coupled to the first source of supply voltage, a second power terminal coupled to the second source of supply voltage, and an output coupled to the output of the output inverter stage.

25. An accurate delay generator as in claim 14 wherein the inverter comprises:
(a) a transistor of a first polarity type having a control terminal coupled to the input, a first controlled terminal coupled to the first power terminal, and a second controlled terminal coupled to the output; and
(b) a transistor of a second polarity type having a control terminal coupled to the input, a first controlled terminal coupled to the second power terminal, and a second controlled terminal coupled to the output.

26. An accurate delay generator for delaying the falling edge of an input signal comprising:
(a) an input inverter stage having an input for receiving the input signal and an output;
(b) a current switch having an input coupled to the output of the input inverter stage, first and second current inputs, and a current output;
(c) means for charging having a first controlled terminal coupled to a first source of supply voltage, a control terminal coupled to a second source of supply voltage, and a second controlled terminal coupled to the first current input of the current switch;
(d) means for discharging having a control terminal, a first controlled terminal coupled to a second source of supply voltage, and a second controlled terminal coupled to the second current input of the current switch;
(e) means coupled to the control terminal of the discharging means for generating a first multiple threshold voltage with respect to the second source of voltage, wherein the value of the first multiple threshold voltage is equal to N times a threshold voltage of the first multiple threshold voltage generating means, where N is an integer greater than one;
(f) means for storing charge coupled to the current output of the current switch; and
(g) an output inverter stage having an input coupled to the current output of the current switch and an output for providing a delayed version of the input signal.

27. An accurate delay generator as in claim 26 wherein the charging means comprises a first transistor of a first polarity type having a control terminal coupled to the control terminal of the charging means, a first controlled terminal coupled to the first controlled terminal of the charging means, and a second controlled terminal coupled to the second controlled terminal of the charging means.

28. An accurate delay generator as in claim 26 wherein the discharging means comprises a second transistor of a second polarity type having a control terminal coupled to the control terminal of the discharging means, a first controlled terminal coupled to the first controlled terminal of the discharging means, and a second controlled terminal coupled to the second controlled terminal of the discharging means.

29. An accurate delay generator as in claim 26 wherein the discharging means comprises:
(a) a plurality of transistors of a second polarity type each having a control terminal, a first controlled terminal, and a second controlled terminal, the first controlled terminals being coupled together and to the second source of supply voltage and the second controlled terminals being coupled together and to the second current input of the current switch; and
(b) a plurality of switches for selectively energizing the control terminal of each of the transistors.

30. An accurate delay generator as in claim 26 wherein the current switch comprises:
(a) a third transistor of a first polarity type; and
(b) a fourth transistor of a second polarity type, the third transistor having a control terminal coupled to the input, a first controlled terminal coupled to the first current input, and a second controlled terminal coupled to the current output, and the fourth transistor having a control terminal coupled to the input, a first controlled terminal coupled to the second current input, and a second controlled terminal coupled to the current output.

31. An accurate delay generator as in claim 26 wherein the first multiple threshold voltage generating means comprises fifth and sixth transistors of a second polarity type each having a control terminal and first and second controlled terminals, the first controlled terminal of the fifth transistor being coupled to the second source of supply voltage, the control terminal and the second controlled terminal of the fifth transistor being coupled together and to the first controlled terminal of the sixth transistor, the control terminal and the second controlled terminal of the sixth transistor being coupled together and to the control terminal of the discharging means to product the first multiple threshold voltage.

32. An accurate delay generator as in claim 26 wherein the charge storing means comprises a transistor of a second polarity type having a control terminal coupled to the current output of the current switch and first and second controlled terminals coupled to the second source of supply voltage.

33. An accurate delay generator as in claim 26 wherein the charge storing means comprises:
 (a) a plurality of transistors of a second polarity type each having a control terminal and first and second controlled terminals, the first and second controlled terminals being coupled together and to the second source of supply voltage; and
 (b) a plurality of switches for selectively coupling the control terminal of each of the transistors to the current output of the current switch.

34. An accurate delay generator as in claim 26 further comprising means coupled to the second controlled terminal of the charging means for generating a second multiple threshold voltage with respect to the second source of supply voltage, wherein the value of the second multiple threshold voltage is equal to M times the threshold voltage where M is an integer greater than two.

35. An accurate delay generator as in claim 34 wherein the second multiple threshold voltage generating means comprises a seventh transistor of a second polarity type interposed between the charging means and the first multiple threshold voltage generating means, the seventh transistor having a first controlled terminal coupled to the first multiple threshold voltage generating means, and a control terminal and a second controlled terminal coupled together and to the second controlled terminal of the charging means to produce the second multiple threshold voltage.

36. An accurate delay generator as in claim 26 wherein the output inverter stage comprises:
 (a) a first inverter having an input coupled to the input of the output inverter stage, a first power terminal coupled to the first source of supply voltage, a second power terminal coupled to the second source of supply voltage, and an output; and
 (b) a second inverter having an input coupled to the output of the first inverter, a first power terminal coupled to the first source of supply voltage, a second power terminal coupled to the second source of supply voltage, and an output coupled to the output of the output inverter stage.

37. An accurate delay generator as in claim 36 wherein the first and second inverters each comprise:
 (a) a transistor of a first polarity type having a control terminal coupled to the input, a first controlled terminal coupled to the first power terminal, and a second controlled terminal coupled to the output; and
 (b) a transistor of a second polarity type having a control terminal coupled to the input, a first controlled terminal coupled to the second power terminal, and a second controlled terminal coupled to the output.

38. An accurate delay generator as in claim 26 wherein the output inverter stage comprises:
 (a) a first inverter having an input coupled to the input of the output inverter stage, a first power terminal coupled to the first current input of the current switch, a second power terminal coupled to the second source of supply voltage, and an output; and
 (b) a second inverter having an input coupled to the output of the first inverter, a first power terminal coupled to the first source of supply voltage, a second power terminal coupled to the second source of supply voltage, and an output coupled to the output of the output inverter stage.

39. An accurate delay generator as in claim 38 wherein the first and second inverters each comprise:
 (a) a transistor of a first polarity type having a control terminal coupled to the input, a first controlled terminal coupled to the first power terminal, and a second controlled terminal coupled to the output; and
 (b) a transistor of a second polarity type having a control terminal coupled to the input, a first controlled terminal coupled to the second power terminal, and a second controlled terminal coupled to the output.

40. An accurate delay generator as in claim 26 wherein the input inverter stage comprises:
 an inverter having an input coupled to the input of the input inverter stage, a first power terminal coupled to the first source of supply voltage, a second power terminal coupled to the second source of supply voltage, and an output coupled to the output of the output inverter stage.

41. An accurate delay generator as in claim 40 wherein the inverter comprises:
 (a) a transistor of a first polarity type having a control terminal coupled to the input, a first controlled terminal coupled to the first power terminal, and a second controlled terminal coupled to the output; and
 (b) a transistor of a second polarity type having a control terminal coupled to the input, a first controlled terminal coupled to the second power terminal, and a second controlled terminal coupled to the output.

* * * * *

UNITED STATES PATENT AND TRADEMARK OFFICE
CERTIFICATE OF CORRECTION

PATENT NO. : 5,051,630

DATED : September 24, 1991

INVENTOR(S) : Grigory Kogan & David McKinney

It is certified that error appears in the above-identified patent and that said Letters Patent is hereby corrected as shown below:

Column 7 (Claim 2) lines 66 & 67:
   delete "multiple threshold voltage"

Column 11 (Claim 19) line 5
   change "product" to --produce--

Column 13 (Claim 31) line 9
   change "product" to --produce--

Column 13 (Claim 34) line 34
   before "threshold" insert --first--

Signed and Sealed this

Twenty-third Day of March, 1993

Attest:

STEPHEN G. KUNIN

Attesting Officer

Acting Commissioner of Patents and Trademarks